(12) United States Patent
Fan et al.

(10) Patent No.: US 10,126,617 B2
(45) Date of Patent: Nov. 13, 2018

(54) METHOD AND DEVICE FOR REPAIRING BRIGHT DOT IN LIQUID CRYSTAL DISPLAY PANEL AND LIQUID CRYSTAL DISPLAY PANEL WITH BRIGHT DOTS REPAIRED

(71) Applicant: Wuhan China Star Optoelectronics Technology Co., Ltd., Wuhan, Hubei (CN)

(72) Inventors: Guangbao Fan, Guangdong (CN); Zhiyuan Shen, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 336 days.

(21) Appl. No.: 14/785,105

(22) PCT Filed: Jul. 29, 2015

(86) PCT No.: PCT/CN2015/085393
§ 371 (c)(1),
(2) Date: Oct. 16, 2015

(87) PCT Pub. No.: WO2016/183935
PCT Pub. Date: Nov. 24, 2016

(65) Prior Publication Data
US 2017/0108749 A1    Apr. 20, 2017

(30) Foreign Application Priority Data

May 20, 2015    (CN) .......................... 2015 1 0260724

(51) Int. Cl.
G02F 1/1333    (2006.01)
G02F 1/1362    (2006.01)
(Continued)

(52) U.S. Cl.
CPC .. *G02F 1/136259* (2013.01); *G02F 1/133345* (2013.01); *G02F 1/134309* (2013.01);
(Continued)

(58) Field of Classification Search
CPC ............... G02F 1/136259; G02F 2001/136268
See application file for complete search history.

(56) References Cited

U.S. PATENT DOCUMENTS 6,436,602 B1 *   8/2002   Imahara ............ G02F 1/136259
                                                         349/192
2001/0035920 A1   11/2001   Choi
(Continued)

FOREIGN PATENT DOCUMENTS

CN          101191964 A      6/2008
CN          101533844 A      9/2009
(Continued)

*Primary Examiner* — Phu Vu
(74) *Attorney, Agent, or Firm* — Andrew C. Cheng

(57) ABSTRACT

The present invention provides a method and a device for repairing a bright dot in a liquid crystal display panel, and a liquid crystal display panel with bright dots repaired, wherein the method comprises the step of removing a first electrode connected to abridge located between a pixel electrode and a data line so that the voltage signal provided by the data line to the pixel electrode would be stopped. By the above-described process, the present invention is able to convert bright dots into dark ones, and thereby the scrap rate of a liquid crystal display panel can be reduced significantly which improves the yield rate of products.

3 Claims, 3 Drawing Sheets

(51) Int. Cl.
*G02F 1/1343* (2006.01)
*H01L 27/12* (2006.01)

(52) U.S. Cl.
CPC ...... *G02F 1/136286* (2013.01); *H01L 27/124* (2013.01); *H01L 27/1259* (2013.01); *G02F 2201/121* (2013.01); *G02F 2201/123* (2013.01)

(56) References Cited

U.S. PATENT DOCUMENTS

| | | | | |
|---|---|---|---|---|
| 2009/0268119 A1* | 10/2009 | Lee | .................. | G02F 1/136259 349/54 |
| 2010/0128060 A1 | 5/2010 | Ukita | | |
| 2013/0215354 A1* | 8/2013 | Yoon | .................... | G02F 1/1309 349/46 |
| 2015/0153598 A1* | 6/2015 | Morishima | ......... | H01L 27/1259 349/43 |

FOREIGN PATENT DOCUMENTS

| | | | |
|---|---|---|---|
| CN | 101702061 A | 5/2010 | |
| JP | 20010133803 A | 5/2001 | |
| JP | 20070052286 A | 3/2007 | |
| KR | 20060102145 A | 9/2006 | |

\* cited by examiner

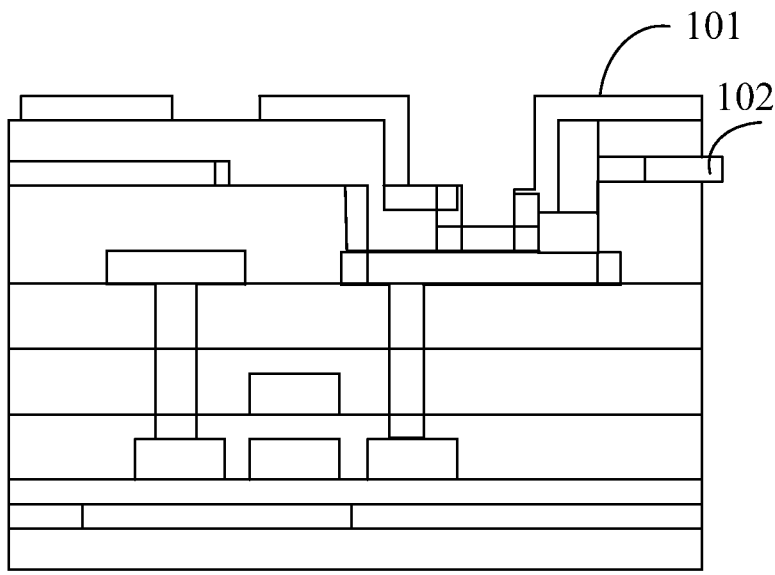

Figure 1

```
                                                              201
┌─────────────────────────────────────────────────────────────┐ /
│ removing a first electrode connected to a bridge located between a pixel electrode and │
│ a data line so that the voltage signal provided by the data line to the pixel electrode │
│                        would be stopped                      │
└─────────────────────────────────────────────────────────────┘
                              │
                              ▼
                                                              202
┌─────────────────────────────────────────────────────────────┐ /
│  depositing tungsten atoms between the pixel electrode and the │
│    common electrode to form a metal firm creating a short    │
│   circuit in the pixel electrode and the common electrode    │
└─────────────────────────────────────────────────────────────┘
```

Figure 2

METHOD AND DEVICE FOR REPAIRING BRIGHT DOT IN LIQUID CRYSTAL DISPLAY PANEL AND LIQUID CRYSTAL DISPLAY PANEL WITH BRIGHT DOTS REPAIRED

FIELD OF THE INVENTION

The present invention relates to a technical field of a liquid crystal display, and more particularly to a method and a device for repairing a bright dot in a liquid crystal display panel, and a liquid crystal display panelwith bright dots repaired.

BACKGROUND OF THE INVENTION

With the development trend of flat panel displays moving forwards a larger size and a higher resolution, which are typically represented by liquid crystal displays (LCD) and organic light-emitting diodes (OLED), thin film transistors (TFT) serving as the core components of flat panel displays also gets wide attention.

During the manufacturing process of the thin-film-transistor liquid-crystal display (TFT-LCD) panels, including a process technology and an operation process, some particles are generated inevitably, and these particles in part can be washed away by cleaning machines, but parts of these particles which could not be cleaned may remain on the thin-film-transistor liquid-crystal display panels, such as on an array substrate or on a color filter substrate. These residual particles which remain on the thin-film-transistor liquid-crystal display panels can also cause bright dots, bright lines, broken bright dots, and weak bright lines, etc. after thin-film-transistor liquid-crystal display panels are lit up, and these bright dots or bright lines will significantly affect the performance of the thin-film-transistor liquid-crystal display panels.

In order to ensure the quality of the thin-film-transistor liquid-crystal display panels and the vision of humanity, bright dots should never exist, and if there are bright dots or bright lines in thin-film-transistor liquid-crystal display panels during the manufacturing process of the thin-film-transistor liquid-crystal display panels, the product is usually scrapped, and which brings a great loss to the manufacturer. Accordingly, whenever bright dots or bright lines appear, generally measures will be taken to darken bright dots or bright lines.

In the existing prior art, the metal layer between the pixel electrode and the common electrode is generally melted by sputtering to create a short circuit in the pixel electrode and the common electrode for achieving the goal of darkening bright dots or bright lines, but the above-described method can only be used when there is an overlapping area between the metal layer of the pixel electrode and the metal layer of the common electrode. However, there is no more overlapping area between the metal layer of the pixel electrode and the metal layer of the common electrode after the introduction of new technology, particularly low-temperature polysilicon (LTPS) thin-film-transistor liquid-crystal display (TFT-LCD) panels, such as shown in FIG. 1, there is no any overlapping area between the metal layer of the pixel electrode 101 and the metal layer of the common electrode 102. Thus, the above-described method in prior art is no longer applicable.

SUMMARY OF THE INVENTION

It is the primarily object of the present invention is to provide a method and a device for repairing a bright dot in a liquid crystal display panel, and a liquid crystal display panelwith bright dots repaired, so the scrap rate of a liquid crystal display panel can be reduced significantly which improves the yield rate of products.

In order to resolve the above technical issue encountered by the prior art, the technical proposal initiated by the present invention is to provide a method for repairing a bright dot in a liquid crystal display panel, comprising the step of:

removing a first electrode connected to abridge located between a pixel electrode and a data line so that the voltage signal provided by the data line to the pixel electrode would be stopped.

Wherein the method for repairing a bright dot further includes the step of depositing metal atoms between the pixel electrode and a common electrode to form a metal film creating a short circuit in the pixel electrode and the common electrode.

Wherein tungsten atoms are deposited between the pixel electrode and the common electrode to form a metal film creating a short circuit in the pixel electrode and the common electrode.

Wherein the step of removing the first electrode connected to abridge located between the pixel electrode and the data line so that the voltage signal provided by the data line to the pixel electrode would be stopped substantially includes the sub-step of:

removing the first electrode connected to abridge located between the pixel electrode and the data line by a femtosecond laser process.

Wherein the step of depositing tungsten atoms between the pixel electrode and the common electrode to form the metal film creating a short circuit in the pixel electrode and the common electrode substantially includes the sub-step of:

depositing tungsten atoms between the pixel electrode and the common electrode using the laser assisted chemical vapor deposition process to form the metal film creating a short circuit in the pixel electrode and the common electrode.

Wherein the step of removing the first electrode connected to abridge located between the pixel electrode and the data line so that the voltage signal provided by the data line to the pixel electrode would be stopped further includes the previous step of:

removing the insulating layer covering the surface of the first electrode.

Wherein the step of removing the insulating layer covering the surface of the first electrode substantially includes the sub-step of:

removing the insulating layer covering the surface of the first electrode by a femtosecond laser process.

In order to resolve the above technical issue encountered by the prior art, the another technical proposal initiated by the present invention is to provide a device for repairing a bright dot, comprising a removing module, which is used to remove a first electrode connected to abridge located between a pixel electrode and a data line so that the voltage signal provided by the data line to the pixel electrode would be stopped.

The device for repairing a bright dot further includes metal film forming module, which is used to deposit the metal atoms between the pixel electrode and a common electrode to form a metal film creating a short circuit in the pixel electrode and the common electrode.

Wherein the metal film forming module is used to deposit tungsten atoms between the pixel electrode and the common electrode to form the metal film creating a short circuit in the pixel electrode and the common electrode.

Wherein the metal film forming module is used to deposit tungsten atoms between the pixel electrode and the common electrode using the laser assisted chemical vapor deposition process to form the metal film creating a short circuit in the pixel electrode and the common electrode.

Wherein the removing module is used to remove the first electrode connected to abridge located between the pixel electrode and the data line by a femtosecond laser process.

Wherein the removing module is further used to remove the insulating layer covering the surface of the first electrode before removing the electrode connected to abridge located between the pixel electrode and the data line so that the voltage signal provided by the data line to the pixel electrode would be stopped.

Wherein the removing module is used to remove the insulating layer covering the surface of the first electrode by a femtosecond laser process.

In order to resolve the above technical issue encountered by the prior art, the another technical proposal initiated by the present invention is to provide a liquid crystal display panel, comprising an array substrate which includes a plurality of scan lines and data lines, which is mutually intersected and insulated with each other, wherein the array substrate includes at least one pixel area whose pixel electrodes are electrically insulated with the scan lines.

Wherein a short circuit is in the pixel electrode and the common electrode due to one layer of metal film, wherein the metal film is formed by depositing metal atoms between the pixel electrode and the common electrode.

Wherein the metal film is formed by depositing tungsten atoms between the pixel electrode and the common electrode.

The present invention can be concluded with the following advantages: different from the prior art, the present invention provides a method comprising the step of removing a first electrode connected to abridge located between a pixel electrode and a data line so that the voltage signal provided by the data line to the pixel electrode would be stopped, and then the voltage of the pixel electrode becomes zero to overcome the differential pressure between the pixel electrode and the common electrode, so liquid-crystal molecules will also not be deflected again, and bright dots are completely converted into dark dots, and thereby the scrap rate of a liquid crystal display panel can be reduced significantly which improves the yield rate of products.

BRIEF DESCRIPTION OF DRAWINGS

FIG. 1 is a cross-sectional structural and illustrational view of a prior art liquid crystal display panel without repair;

FIG. 2 is a flow-chart diagram illustrating the steps of performing the method for repairing a bright dot in a liquid crystal display panel provided by the present invention;

DETAILED DESCRIPTION OF PREFERRED EMBODIMENTS

Referring to FIG. 1, which is a flow-chart diagram illustrating the steps of performing the method for repairing a bright dot in a liquid crystal display panel provided by the present invention. The preferable embodiment provides the method for repairing a bright dot, comprising the step of:

101: removing a first electrode connected to a bridge located between a pixel electrode and a data line so that the voltage signal provided by the data line to the pixel electrode would be stopped.

A liquid crystal display panel comprises an array substrate, a color filter substrate, and liquid-crystal molecules sandwiched between the array substrate and the color filter substrate, and the array substrate includes a plurality of scan lines and data lines, which is mutually intersected and insulated with each other, and a plurality of pixel cells formed by the intersection of scan lines and data lines, wherein each pixel area includes a pixel electrode, which connects to a data line through a first electrode located to abridge for obtaining the data signals provided a data driver through the data line. The array substrate further includes a common electrode, and while the voltage is added between the common electrode and the pixel electrode, the brightness of the liquid crystal display panel could be controlled by controlling the differential pressure between the pixel electrode and the common electrode.

However, some inevitable bright dots may appear during the manufacturing process, which means the brightness of the liquid crystal display panel could not be controlled by the normal differential pressure.

In order to overcome the above impact caused by the abnormal bright dots to the overall performance of the liquid crystal display panel, the essence of the method provided by the present embodiment is to make the differential pressure between the pixel electrode and the common electrode, which generates bright dots, to be 0, so liquid-crystal molecules will not be deflected, and abnormal bright dots will be converted into dark dots.

Figure 3:
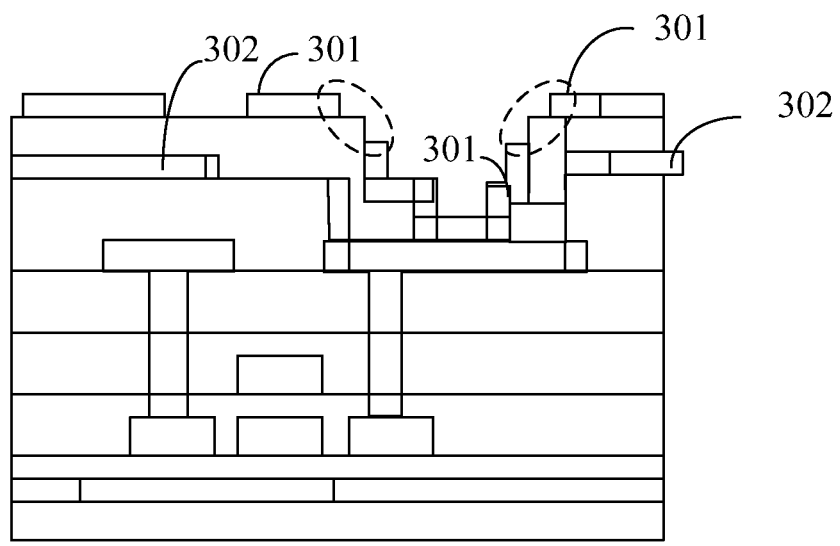
FIG. 3 is a cross-sectional structural and illustrational view of a liquid crystal display panelwith bright dots repaired with the method provided by the preferable embodiment of the present invention.

Referring to FIG. 3, which is a cross-sectional structural and illustrational view of a liquid crystal display panelwith bright dots repaired with the method provided by the preferable embodiment of the present invention. A first electrode connected to abridge located between a pixel electrode and a data line is removed so that the voltage signal provided by the data line to the pixel electrode would be stopped. As shown in FIG. 3, comparing with FIG. 1, the connection of the data line and the pixel electrode 301 are removed respectively, which means the first electrode for conduction between the data line and the pixel electrode, and substantially a hole which is slightly larger than the first electrode is created by a laser process at the connection of the pixel electrode 301 and the data line for removing the first electrode in the hole, such as the marked portion by an elliptical dashed box shown in FIG. 3. The connection between the data line and the pixel electrode is removed, so the voltage provided by the data line to the pixel electrode would be stopped, and the voltage of the pixel electrode 301 is 0. After the voltage signal provided by the data line to the pixel electrode is stopped and the voltage of the pixel electrode drops to 0, because the input voltage of the common electrode does not stop supplying electricity, the differential pressure between the common electrode and the pixel electrode is therefore generated. Under normal circumstances, the voltage of the common electrode is typically ranging between −0.2V to 0.2V, and the differential pressure to make liquid-crystal molecules deflect is around 1V, so the differential pressure between the common electrode and the pixel electrode will not make liquid-crystal molecules deflect, and therefore the abnormal bright dots will be converted into dark dots.

Because the structure of the array substrate is more complex and compact, during the process of removing the first electrode, in order to accurately prevent the damage to other layers caused by the process of removing the first electrode, the present embodiment removes the first electrode by a femtosecond laser process. The controlling accuracy of the femtosecond laser is comparably high, so depth and width of the hole resulted during the process of removing the first electrode could be controlled precisely, and the other layers of the device, such as the pixel electrode, can be effectively protected from the impact.

In another preferable embodiment, the surface and surrounding of a first electrode are covered with an insulating layer, so the insulating layer covering the surface of the first electrode is removed before removing the first electrode connected to abridge located between a pixel electrode and a data line, and the above insulating layer is an insulating passivation layer of silicon nitride (SiNx) under normal conditions, and the insulating layer could be replaced by another insulating layer of same nature in another preferable embodiment, such as amorphous silicon oxide (SiOx), and there is no restriction. In order to ensure the device covered with the insulating layer, such as the first electrode, and the device surrounded by the insulating layer against damage, the present embodiment removes the insulating layer covering the surface of the first electrode by a femtosecond laser process so that depth and width of the removed insulating layer could be controlled precisely.

Although the voltage of the common electrode could be controlled within the rated voltage of deflecting liquid-crystal molecules so that bright dots will be converted into dark dots, there are special circumstances inevitably, so in order to minimize the probability of bright dots the method for repairing a liquid crystal display provided by the preferable embodiment further includes the step 102:

102: depositing metal atoms between the pixel electrode and the common electrode to form a metal film creating a short circuit in the pixel electrode and the common electrode.

The present embodiment deposits metal atoms between the pixel electrode and the common electrode after removing the first electrode connected to abridge located between the pixel electrode and the data line so that the voltage signal provided by the data line to the pixel electrode would be stopped, so the metal film is formed between the pixel electrode and the common electrode to create a short circuit in the pixel electrode and the common electrode.

Figure 4:
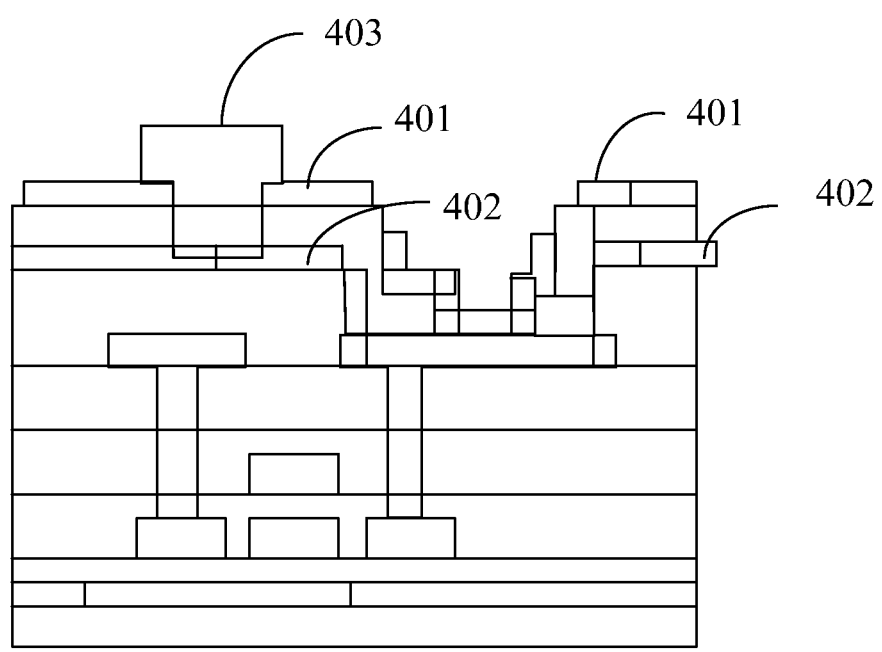
FIG. 4 is a cross-sectional structural and illustrational view of a liquid crystal display panelwith bright dots repaired provided by another preferable embodiment of the present invention.

Substantially, by the laser assisted chemical vapor deposition apparatus, the metal between the pixel electrode and the common electrode is decomposed by using a laser process to form deposition of metal atoms, and thereby the metal film is formed, as 403 shown in FIG. 4, and the metal film 403 connects the pixel electrode 401 and the common electrode 402 so that a short circuit is created in the pixel electrode 401 and the common electrode 402. After the short circuit is created, the voltage of the pixel electrode and the common electrode are same, and the differential pressure is 0, so liquid-crystal molecules will not be deflected, and bright dots will be completely converted into dark dots.

In a preferred embodiment, the tungsten (W) is decomposed by a laser to form the deposition of W atoms, and thereby the metal film is formed for creating a short circuit in the pixel electrode and the common electrode. It should be noted that, in another preferable embodiments, the tungsten (W) could also be substituted by the other metal of the same nature with W, and there is no more limitation.

Distinguished from the prior art, the present embodiment removes the first electrode connected to a bridge located between the pixel electrode and the data line so that the voltage signal provided by the data line to the pixel electrode would be stopped, and the voltage of the pixel electrode becomes zero to overcome the differential pressure between the pixel electrode and the common electrode, and then tungsten atoms are deposited between the pixel electrode and the common electrode, so the metal film is formed to create a short circuit in the pixel electrode and the common electrode, not only to overcome the differential pressure generated between the common electrode and the pixel electrode, but also to equal the voltage of the common electrode and the pixel electrode, and the differential pressure permanently keeps zero, so liquid-crystal molecules will also not be deflected again, and bright dots are completely converted into dark dots, and thereby the scrap rate of a liquid crystal display panel can be reduced significantly which improves the yield rate of products.

Figure 5:
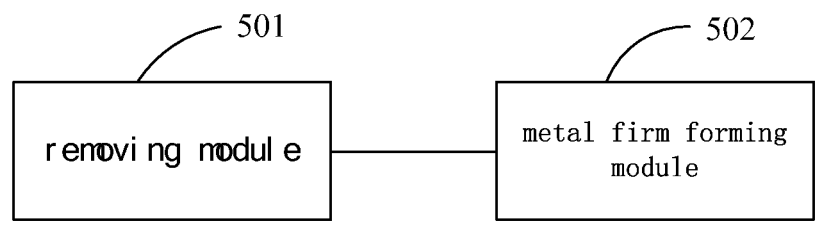
FIG. 5 is a structural and illustrational view illustrating the steps of performing the device for repairing a bright dot in a liquid crystal display panel made in accordance with the present invention.

Referring to FIG. 5, which is a structural and illustrational view illustrating the steps of performing the device for repairing a bright dot in a liquid crystal display panel made in accordance with the present invention. The device for repairing a bright dot provided the preferable embodiment comprises a removing module 201, wherein the removing module 501 is used to remove a first electrode connected to abridge located between a pixel electrode and a data line so that the voltage signal provided by the data line to the pixel electrode would be stopped.

Some inevitable bright dots may appear during the manufacturing process, so the brightness of the liquid crystal display panel could not be controlled by the normal differential pressure.

In order to overcome the above impact caused by the abnormal bright dots to the overall performance of the liquid crystal display panel, the principle of the device for repairing bright dots provided by the preferable embodiment is to make the differential pressure between the pixel electrode and the common electrode to be 0, so liquid-crystal molecules will not be deflected, and abnormal bright dots will be converted into dark dots.

Substantially, the removing module 501 is used to remove the connection of the data line and the pixel electrode respectively, which means the first electrode for conduction between the data line and the pixel electrode, and substantially a hole which is slightly larger than the first electrode is created by a laser process at the connection of the pixel electrode and the data line for removing the first electrode in the hole, and the connection between the data line and the pixel electrode is removed, so the voltage provided by the data line to the pixel electrode would be stopped, and the voltage of the pixel electrode 301 is 0.

After the voltage signal provided by the data line to the pixel electrode is stopped and the voltage of the pixel electrode drops to 0, because the input voltage of the common electrode does not stop supplying electricity, the differential pressure between the common electrode and the pixel electrode is therefore generated. Under normal circumstances, the voltage of the common electrode is typically ranging between −0.2V to 0.2V, and the differential pressure to make liquid-crystal molecules deflect is around 1V, so the differential pressure between the common electrode and the pixel electrode will not make liquid-crystal molecules deflect, and therefore the abnormal bright dots will be converted into dark dots.

Because the structure of the array substrate is more complex and compact, during the process of removing the first electrode, in order to accurately prevent the damage to other layers caused by the process of removing the first electrode, the removing module 501 of the present embodiment is used to remove the first electrode by a femtosecond laser process. The controlling accuracy of the femtosecond laser is comparably high, so depth and width of the hole resulted during the process of removing the first electrode could be controlled precisely, and the other layers of the device, such as the pixel electrode, can be effectively protected from the impact.

In another preferable embodiment, the surface and surrounding of a first electrode are covered with an insulating layer, so the insulating layer covering the surface of the first electrode is removed by the removing module 501 before removing the first electrode connected to abridge located between a pixel electrode and a data line, and the above insulating layer is an insulating passivation layer of silicon nitride (SiNx) under normal conditions, and the insulating layer could be replaced by another insulating layer of same nature in another preferable embodiment, such as amorphous silicon oxide (SiOx), and there is no restriction. In order to ensure the device covered with the insulating layer, such as the first electrode, and the device surrounded by the insulating layer against damage, the removing module 201 of the present embodiment removes the insulating layer covering the surface of the first electrode by a femtosecond laser process so that depth and width of the removed insulating layer could be controlled precisely.

Although the voltage of the common electrode could be controlled within the rated voltage of deflecting liquid-crystal molecules by the device for repairing bright dots so that bright dots will be converted into dark dots, there are special circumstances inevitably, so in order to minimize the probability of bright dots the device for repairing a liquid crystal display provided by the preferable embodiment further includes a metal film forming module 502, wherein the metal film forming module 202 is used to deposit the metal atoms between the pixel electrode and a common electrode to form a metal film creating a short circuit in the pixel electrode and the common electrode.

After the removing module 501 of the present embodiment removes the first electrode connected to abridge located between the pixel electrode and the data line so that the voltage signal provided by the data line to the pixel electrode would be stopped, the metal film forming module 502 is used to deposit metal atoms between the pixel electrode and the common electrode, so the metal film is formed between the pixel electrode and the common electrode to create a short circuit in the pixel electrode and the common electrode.

Substantially, the metal film forming module 502 is used to decompose the metal between the pixel electrode and the common electrode using a laser process by the laser assisted chemical vapor deposition apparatus to form deposition of metal atoms, and thereby the metal film is formed, and the metal film connects the pixel electrode and the common electrode so that a short circuit is created in the pixel electrode and the common electrode. After the short circuit is created, the voltage of the pixel electrode and the common electrode are same, and the differential pressure is 0, so liquid-crystal molecules will not be deflected, and bright dots will be completely converted into dark dots.

In a preferred embodiment, the metal film forming module 502 is used to decompose the tungsten (W) by a laser to form the deposition of W atoms, and thereby the metal film is formed for creating a short circuit in the pixel electrode and the common electrode. It should be noted that, in another preferable embodiments, the tungsten (W) could also be substituted by the other metal of the same nature with W, and there is no more limitation.

Distinguished from the prior art, the removing module of the present embodiment removes the first electrode connected to a bridge located between the pixel electrode and the data line so that the voltage signal provided by the data line to the pixel electrode would be stopped, and the voltage of the pixel electrode becomes zero to overcome the differential pressure between the pixel electrode and the common electrode, and then tungsten atoms are deposited between the pixel electrode and the common electrode, so the metal film is formed to create a short circuit in the pixel electrode and the common electrode, not only to overcome the differential pressure generated between the common electrode and the pixel electrode, but also to equal the voltage of the common electrode and the pixel electrode, and the differential pressure permanently keeps zero, so liquid-crystal molecules will also not be deflected again, and bright dots are completely converted into dark dots, and thereby the scrap rate of a liquid crystal display panel can be reduced significantly which improves the yield rate of products.

The present invention further provides a liquid crystal display panel with bright dots repaired, comprising an array substrate, a color filter substrate, and liquid-crystal molecules sandwiched between the array substrate and the color filter substrate, and the array substrate includes a plurality of scan lines and data lines, which is mutually intersected and insulated with each other, and a plurality of pixel cells formed by the intersection of scan lines and data lines, wherein each pixel area includes a pixel electrode, which connects to a data line through a first electrode located to abridge for obtaining the data signals provided a data driver through the data line. The array substrate further includes a common electrode, and while the voltage is added between the common electrode and the pixel electrode, the brightness of the liquid crystal display panel could be controlled by controlling the differential pressure between the pixel electrode and the common electrode.

The array substrate further includes at least one pixel area whose pixel electrodes are electrically insulated with the scan lines.

Although the voltage of the common electrode could be controlled within the rated voltage of deflecting liquid-crystal molecules so that bright dots will be converted into dark dots, there are special circumstances inevitably, so in order to minimize the probability of bright dots, in a preferable embodiment, a short circuit is created in the pixel electrode and the common electrode by the metal film, which is formed by deposition of tungsten atoms.

Wherein the pixel electrode in the pixel area is electrically insulated with the common electrode by the method for repairing bright dots of any embodiment illustrated by FIG. 1 to FIG. 4 or the device for repairing bright dots of any embodiment illustrated by FIG. 5, and a short circuit is created in the pixel electrode and the common electrode. As a result, no additional description is given here below.

The first electrode connected to a bridge located between the pixel electrode and the data line is removed, so the voltage signal provided by the data line to the pixel electrode would be stopped, and the voltage of the pixel electrode becomes zero to overcome the differential pressure between the pixel electrode and the common electrode, and then tungsten atoms are deposited between the pixel electrode and the common electrode, so the metal film is formed to create a short circuit in the pixel electrode and the common electrode, not only to overcome the differential pressure generated between the common electrode and the pixel electrode, but also to equal the voltage of the common electrode and the pixel electrode, and the differential pressure permanently keeps zero, so liquid-crystal molecules will also not be deflected again, and bright dots are completely converted into dark dots, and thereby the scrap rate of a liquid crystal display panel can be reduced significantly which improves the yield rate of products.

Described above is only an embodiment of the present invention should not be limiting the scope of the present invention patent, any use of the contents of the present specification and the drawings or by an equivalent process equivalent structural transformation, directly or indirectly, related technologies used in the other areas are similarly included in the protection scope of the patent invention.

The invention claimed is:

1. A method for repairing a bright dot in a liquid crystal display panel, comprising the step of:
   removing a first electrode connected to abridge located between a pixel electrode and a data line so that the voltage signal provided by the data line to the pixel electrode would be stopped;
   wherein the method for repairing a bright dot further includes the step of depositing metal atoms between the pixel electrode and a common electrode to form a metal film creating a short circuit in the pixel electrode and the common electrode;
   wherein tungsten atoms are deposited between the pixel electrode and the common electrode to form a metal film creating a short circuit in the pixel electrode and the common electrode;
   wherein the step of depositing tungsten atoms between the pixel electrode and the common electrode to form the metal film creating a short circuit in the pixel electrode and the common electrode substantially includes the sub-step of: depositing tungsten atoms between the pixel electrode and the common electrode using the laser assisted chemical vapor deposition process to form the metal film creating a short circuit in the pixel electrode and the common electrode;
   wherein the step of removing the first electrode connected to abridge located between the pixel electrode and the data line so that the voltage signal provided by the data line to the pixel electrode would be stopped substantially includes the sub-step of: removing the first electrode connected to abridge located between the pixel electrode and the data line by a femtosecond laser process.

2. The method as recited in claim 1, wherein the step of removing the first electrode connected to abridge located between the pixel electrode and the data line so that the voltage signal provided by the data line to the pixel electrode would be stopped further includes the previous step of:
   removing the insulating layer covering the surface of the first electrode;
   wherein the step of removing the insulating layer covering the surface of the first electrode substantially includes the sub-step of: removing the insulating layer covering the surface of the first electrode by a femtosecond laser process.

3. A liquid crystal display panel with bright dots repaired, comprising an array substrate which includes a plurality of scan lines and data lines, which is mutually intersected and insulated with each other, wherein the array substrate includes at least one pixel area whose pixel electrodes are electrically insulated with the scan lines;
   wherein a short circuit is in the pixel electrode and the common electrode due to one layer of metal film, wherein the metal film is formed by depositing metal atoms between the pixel electrode and the common electrode;
   wherein the metal film is formed by depositing tungsten atoms between the pixel electrode and the common electrode.

* * * * *